US010727823B2

(12) United States Patent
Liu et al.

(10) Patent No.: US 10,727,823 B2
(45) Date of Patent: Jul. 28, 2020

(54) METHOD FOR ADJUSTING ELECTROMAGNETIC WAVE, AND METAMATERIAL

(71) Applicant: SHENZHEN SUPER DATA LINK TECHNOLOGY LTD., Shenzhen (CN)

(72) Inventors: Ruopeng Liu, Shenzhen (CN); Chunlin Ji, Shenzhen (CN); Jing Nie, Shenzhen (CN); YanQing Tan, Shenzhen (CN)

(73) Assignee: SHEN ZHEN KUANG-CHI HEZHONG TECHNOLOGY LTD, Shenzhen (CN)

( * ) Notice: Subject to any disclaimer, the term of this patent is extended or adjusted under 35 U.S.C. 154(b) by 0 days.

(21) Appl. No.: 16/184,036

(22) Filed: Nov. 8, 2018

(65) Prior Publication Data

US 2019/0081618 A1 Mar. 14, 2019

Related U.S. Application Data

(63) Continuation of application No. PCT/CN2017/079576, filed on Apr. 6, 2017.

(30) Foreign Application Priority Data

May 19, 2016 (CN) .......................... 2016 1 0339819

(51) Int. Cl.
*H03K 5/00* (2006.01)
*H01Q 15/14* (2006.01)
(Continued)

(52) U.S. Cl.
CPC ............... *H03K 5/00* (2013.01); *H01Q 15/00* (2013.01); *H01Q 15/14* (2013.01); *H03H 11/02* (2013.01); *H03K 2005/00286* (2013.01)

(58) Field of Classification Search
CPC ........... H03K 5/00; H03H 11/00; H03H 11/02
See application file for complete search history.

(56) References Cited

U.S. PATENT DOCUMENTS 6,897,831 B2    5/2005 McKinzie
7,532,397 B2 *  5/2009 Tanaka ................. G02F 1/0136
                                                    359/485.02
(Continued)

FOREIGN PATENT DOCUMENTS

CN    103474775 A  * 12/2013
CN    103474775 A    12/2013
(Continued)

OTHER PUBLICATIONS

Chen et al., "Experimental retrieval of the effective parameters of metamaterials based on a waveguide method", Dec. 2006, Optics Express, vol. 14 No. 26, pp. 12944-12949 (Year: 2006).*
(Continued)

*Primary Examiner* — Dean O Takaoka
*Assistant Examiner* — Alan Wong
(74) *Attorney, Agent, or Firm* — Cantor Colburn LLP

(57) ABSTRACT

A metamaterial comprises a plurality of electrically controllable metamaterial units each comprising a varactor diode; the predetermined angle is an angle at which an electromagnetic wave is reflected from a surface of the metamaterial; there is an association relationship between the predetermined angle and the first phase difference; the method comprises: determining a first phase difference between electromagnetic waves reflected by two adjacent electrically controllable metamaterial units in a metamaterial based on a predetermined angle; determining a target capacitance of the varactor diode in each electrically controllable metamaterial unit based on the first phase difference; and adjusting a
(Continued)

capacitance of the varactor diode in each electrically controllable metamaterial unit to the target capacitance.

19 Claims, 6 Drawing Sheets

(51) Int. Cl.
*H01Q 15/00* (2006.01)
*H03H 11/02* (2006.01)

(56) References Cited

U.S. PATENT DOCUMENTS

| | | | | |
|---|---|---|---|---|
| 8,174,341 B2* | 5/2012 | Lee | ............ | H01P 7/082 333/219 |
| 8,908,251 B2* | 12/2014 | Sayyah | ............ | G02F 1/292 359/254 |
| 8,974,893 B2* | 3/2015 | Liu | ............ | B81B 7/00 428/195.1 |
| 8,989,750 B2* | 3/2015 | Mochizuki | ............ | H01Q 15/02 455/446 |
| 9,425,512 B2* | 8/2016 | Maruyama | ............ | H01Q 21/0018 |
| 9,608,564 B2* | 3/2017 | Poddar | ............ | H03B 1/02 |
| 2009/0109121 A1 | 4/2009 | Herz | | |
| 2014/0210475 A1 | 7/2014 | Li et al. | | |

FOREIGN PATENT DOCUMENTS

| | | |
|---|---|---|
| CN | 105006649 A | 10/2015 |
| CN | 105305091 A | 2/2016 |

OTHER PUBLICATIONS

European Search Report for corresponding application 17798563.7, Report dated Nov. 19, 2019.

Jungmi Honh, "Tunable Electromagnetic Gradient Surface for Beam Steering by Using Varactor Diodes", 2013 Proceedings of the International Symposium on Antennas, vol. 2, Oct. 23, 2013, pp. 1211-1214, XP032554383.

* cited by examiner

METHOD FOR ADJUSTING ELECTROMAGNETIC WAVE, AND METAMATERIAL

TECHNICAL FIELD

The present invention relates to the communication field, and in particular, to a method for adjusting an electromagnetic wave, and a metamaterial.

BACKGROUND

Currently, after most metamaterials used for adjusting an electromagnetic wave are manufactured, controlling of the electromagnetic wave is fixed and unadjustable. For example, a particular metamaterial can only change a direction of the electromagnetic wave that is incident to the metamaterial by a specific angle, and cannot change the direction of the electromagnetic wave by another angle. This limits an application range of the metamaterial that is used for adjusting the electromagnetic wave.

In recent years, the metamaterial used for dynamically adjusting the electromagnetic wave has attracted wide attention of researchers. The adjustment of the electromagnetic wave can be implemented in the following two manners.

Manner 1: the adjustment of the electromagnetic wave can be implemented through mechanical rotation. However, there are disadvantages, for example, a scanning speed is low, a mechanical metal device is heavy and occupies large space, mechanical faults occur frequently, and frequent maintenance is required.

Manner 2: electromagnetic parameters of some parts of the metamaterial can also be controlled by using some controllable components such as a PIN diode. However, as a quantity of states for adjusting a phase is increased, a control circuit is quite complex, the manufacturing is complex, and costs are very high.

For the foregoing problems, no effective solution is currently proposed.

SUMMARY

Embodiments of the present invention provide a method for adjusting an electromagnetic wave, and a metamaterial, to solve at least one technical problem that a metamaterial cannot dynamically adjust an electromagnetic wave in a simple and fast manner in the prior art.

According to one aspect of the embodiments of the present invention, a method for adjusting an electromagnetic wave, comprising: determining a first phase difference between electromagnetic waves reflected by two adjacent electrically controllable metamaterial units in a metamaterial based on a predetermined angle; wherein the metamaterial comprises a plurality of electrically controllable metamaterial units, the electrically controllable metamaterial unit comprises a varactor diode; the predetermined angle is an angle at which an electromagnetic wave is reflected from a surface of the metamaterial; there is an association relationship between the predetermined angle and the first phase difference; determining a target capacitance of the varactor diode in each electrically controllable metamaterial unit based on the first phase difference; and adjusting a capacitance of the varactor diode in each electrically controllable metamaterial unit to the target capacitance.

Further, determining a target capacitance of the varactor diode in each electrically controllable metamaterial unit based on the first phase difference comprises: obtaining a first curve in which a phase of the metamaterial changes with a frequency of the metamaterial at different capacitances; obtaining a second curve in which the phase of the metamaterial changes with the capacitance of the varactor diode at the first frequency based on the first curve and a first frequency of the electromagnetic wave that is incident to the surface of the metamaterial; and obtaining the target capacitance that is corresponding to the first phase difference from the second curve.

Further, the metamaterial comprises a plurality of substructures, the substructure comprises a plurality of row units, each row unit comprises the electrically controllable metamaterial units, and obtaining the target capacitance that is corresponding to the first phase difference from the second curve comprises: determining a quantity of row units in the substructure based on the first phase difference; determining a phase that is corresponding to each row unit based on the quantity of row units; obtaining a capacitance that is associated with the phase from the second curve; and regarding the obtained capacitance as the target capacitance of the corresponding row unit.

Further, determining a quantity of row units in the substructure based on the first phase difference comprises: determining the quantity of row units based on the following formula:

$$\Delta \varphi_{deg} = \frac{360°}{N},$$

wherein N is the quantity of row units in each substructure, and $\Delta \varphi_{deg}$ is the first phase difference.

Further, adjusting a capacitance of the varactor diode in each electrically controllable metamaterial unit to the target capacitance comprises: searching a target voltage that is corresponding to the target capacitance from a predetermined association relationship between a capacitance and a voltage; and applying the target voltage across the varactor diode.

Further, applying the target voltage across the varactor diode comprises: applying the target voltage across the varactor diode, which is disposed in an opening of a metal microstructure of the electrically controllable metamaterial unit, by the metal microstructure; wherein the metal microstructure is connected to a feed network through an coaxial through hole that is disposed on the metal microstructure.

Further, determining a first phase difference between electromagnetic waves reflected by two adjacent electrically controllable metamaterial units in a metamaterial based on a predetermined angle comprises: determining the first phase difference based on the formula:

$$\theta = \arcsin\left(\frac{\lambda}{p} \cdot \frac{\Delta \varphi_{deg}}{360°}\right),$$

wherein θ is the predetermined angle, $\Delta \varphi_{deg}$ is the first phase difference, λ is a wavelength of the electromagnetic wave, p is a length of the electrically controllable metamaterial unit; a length and a width of the electrically controllable metamaterial unit are equal, and a distance between center points of the two adjacent electrically controllable metamaterial units is equal to the length of the electrically controllable metamaterial unit.

Further, a capacitance of the varactor diode is from 0.06 pF to 3 pF.

Further, a reflection loss of an electromagnetic wave that is reflected from a surface of the metamaterial is less than −2 dB.

According to another aspect of the embodiments of the present invention, a metamaterial includes a substrate material; and an electrically controllable metamaterial unit array attached on the substrate material and comprising a plurality of electrically controllable metamaterial units. The electrically controllable metamaterial unit includes: a metal microstructure; a varactor diode disposed in an opening of the metal microstructure; and a coaxial through hole disposed on the metal microstructure. wherein the metal microstructure is connected to a feed network through the coaxial through hole and is configured for applying a voltage across the varactor diode.

Further, the metal microstructure is a double k-shaped metal microstructure.

Further, a material of the metal microstructure is any one of the following: copper, silver, and gold.

Further, the substrate material is a nonmagnetic medium material, a permittivity of the substrate material is from 2 to 10, and a permeability of the substrate material is equal to 1.

Further, an electromagnetic wave perpendicularly incident to a surface of the metal microstructure is a plane wave, an amplitude and a phase of the electromagnetic wave are the same in a direction that is perpendicular to the incident direction.

Further, the metamaterial comprises a plurality of substructures, the substructure comprises a plurality of row units, a quantity of row units in each substructure and a first phase difference satisfy an expression:

$$\Delta\varphi_{deg} = \frac{360°}{N},$$

wherein N is the quantity of row units in each substructure, and $\Delta\varphi_{deg}$ is the first phase difference; there is the first phase difference between electromagnetic waves reflected by two adjacent electrically controllable metamaterial units in the metamaterial.

Further, a length and a width of the electrically controllable metamaterial unit are equal, and a distance between center points of two adjacent electrically controllable metamaterial units is the same as the length of the electrically controllable metamaterial unit.

Further, the metamaterial further comprises: a ground plate; and a foam layer disposed between the ground plate and the substrate material.

Further, a frequency of an electromagnetic wave that is incident to a surface of the metamaterial is from 0.3 GHz to 300 GHz.

Further, a capacitance of the varactor diode is from 0.06 pF to 3 pF.

Further, a reflection loss of an electromagnetic wave that is reflected from a surface of the metamaterial is less than −2 dB.

When a reflection direction of an electromagnetic wave that is incident to a surface of the metamaterial needs to be changed, a first phase difference is determined based on an angle (a predetermined angle), that needs to be obtained, of the reflection direction of the electromagnetic wave, wherein there is an association relationship between the predetermined angle and the first phase difference. Then a target capacitance of a varactor diode in each electrically controllable metamaterial unit is determined based on the first phase difference, and a target voltage that needs to be applied across the varactor diode is determined based on the target capacitance. After the target voltage is applied across the varactor diode, a capacitance of the varactor diode is the target capacitance, a phase difference between electromagnetic waves reflected by two adjacent electrically controllable metamaterial units is the first phase difference, and an obtained angle in the reflection direction of the electromagnetic wave is the predetermined angle. Because the predetermined angle may be any angle in a large range, provided that a voltage corresponding to the predetermined angle is applied across the varactor diode, a direction in which an electromagnetic wave is reflected from the surface of the metamaterial can be adjusted in a large contiguous range. This achieves a technical effect of dynamically adjusting the electromagnetic wave in a simple and fast manner, and further solves a technical problem that a metamaterial cannot dynamically adjust the electromagnetic wave in a simple and fast manner in the prior art.

BRIEF DESCRIPTION OF DRAWINGS

The drawings described herein provide further understanding of the present invention, and form some of this application. Schematic embodiments of the present invention and descriptions thereof are used to explain the present invention but do not constitute an inappropriate limitation on the present invention. In the drawings:

FIG. 7-1 is a curve in which reflectivity of an electromagnetic wave that is reflected from a surface of the metamaterial changes with a reflection angle when a first phase difference $\Delta\varphi_{deg}$ is zero and a predetermined angle θ is zero according to an embodiment of the present invention.

FIG. 7-2 is a curve in which reflectivity of the electromagnetic wave that is reflected from a surface of the metamaterial changes with a reflection angle when a first phase difference $\Delta\varphi_{deg}$ is 60° and a predetermined angle θ is 22.1° according to an embodiment of the present invention.

FIG. 7-3 is a curve in which reflectivity of an electromagnetic wave that is reflected from a surface of the metamaterial changes with a reflection angle when a first phase difference $\Delta\varphi_{deg}$ is 90° and a predetermined angle θ is 32.4° according to an embodiment of the present invention.

FIG. 7-4 is a curve in which reflectivity of an electromagnetic wave that is reflected from a surface of the metamaterial changes with a reflection angle when a first phase difference $\Delta\varphi_{deg}$ is 120° and a predetermined angle θ is 45.6° according to an embodiment of the present invention

DESCRIPTION OF EMBODIMENTS

Figure 1:
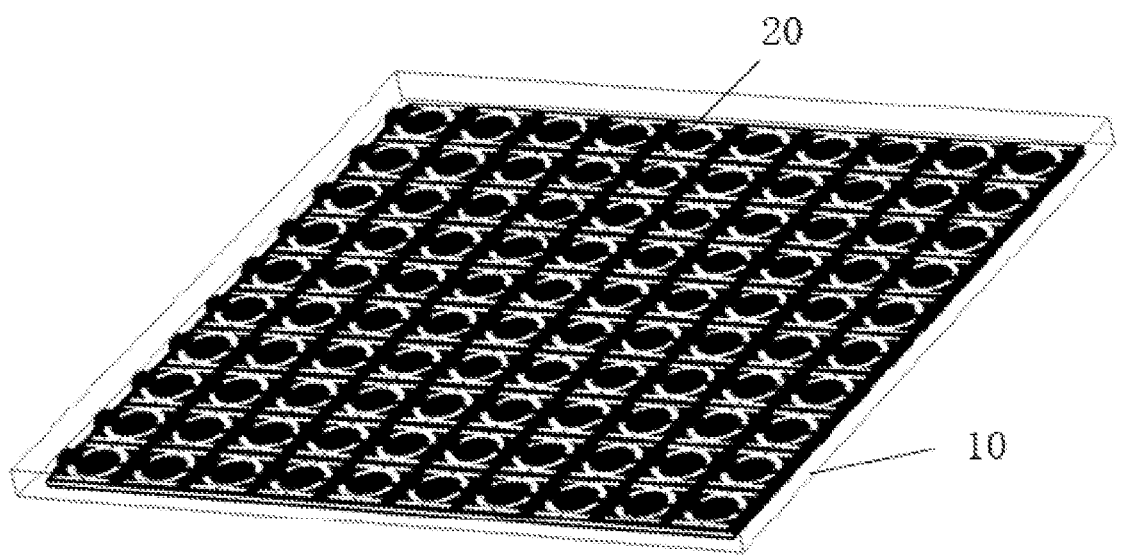
FIG. 1 illustrates a metamaterial according to an embodiment of the present invention.

To make a person skilled in the art better understand solutions of the present invention, the following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

It should be noted that terms such as "first" and "second" in the specification, claims, and accompanying drawings of the present invention are used to distinguish between similar objects, and are not necessarily used to describe a particular sequence or order. It should be understood that data used in such a way may be interchangeable in a proper circumstance, so that the embodiments of the present invention described herein can be implemented in a sequence other than those shown in the drawings or described herein. Moreover, terms "including", "having", and any other variant thereof are intended to cover a non-exclusive inclusion. For example, a process, a method, a system, a product, or a device that includes a series of steps or units is not necessarily limited to those expressly listed steps or units, but may include other steps or units that are not expressly listed or that are inherent to such a process, method, product, or device.

An embodiment of the present invention provides a metamaterial.

FIG. 1 illustrates a metamaterial according to an embodiment of the present invention. As shown in FIG. 1, the metamaterial includes a substrate material 10 and an electrically controllable metamaterial unit array 20. The electrically controllable metamaterial unit array 20 is attached on the substrate material 10 and includes a plurality of electrically controllable metamaterial units.

Figure 2:
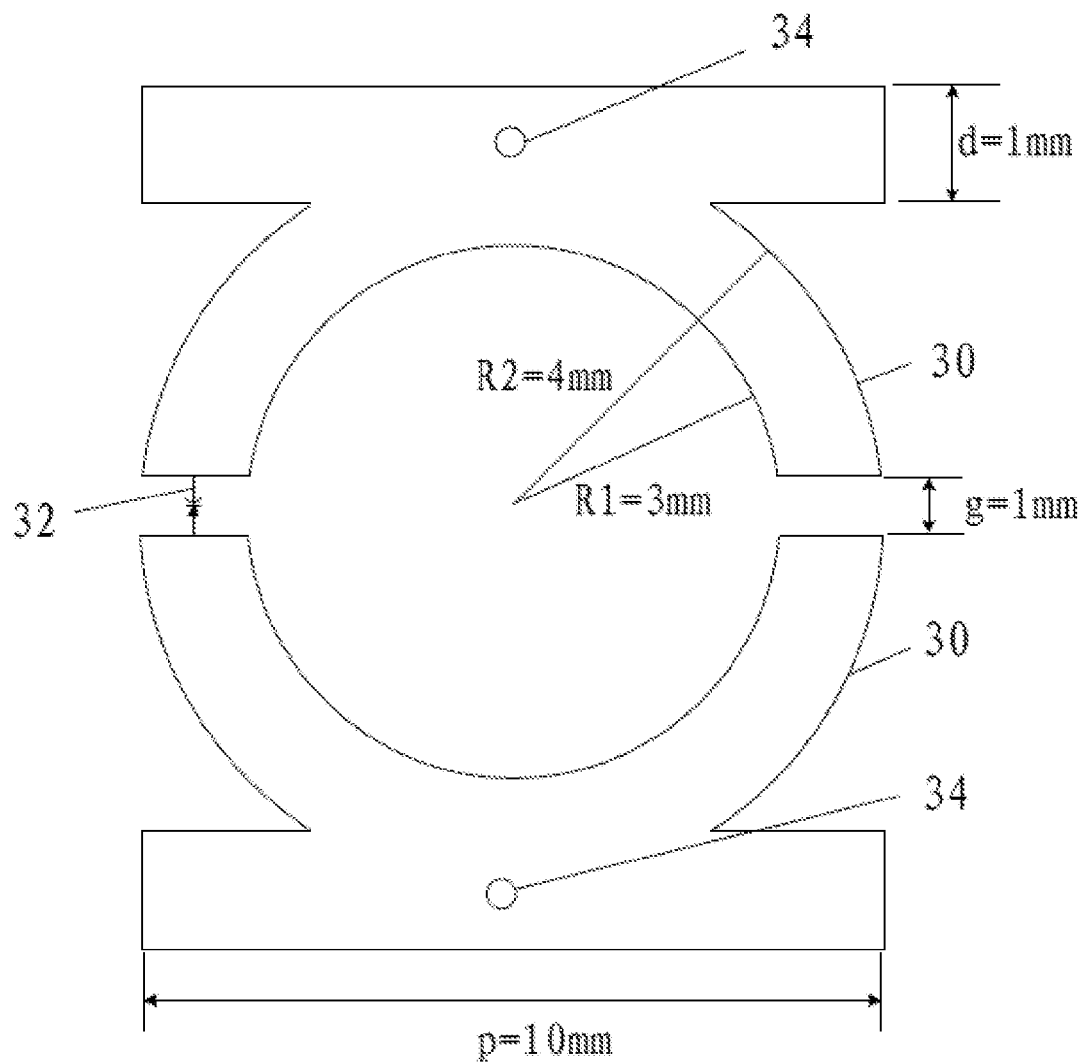
FIG. 2 illustrates an electrically controllable metamaterial unit according to an embodiment of the present invention.

FIG. 2 illustrates the electrically controllable metamaterial unit according to an embodiment of the present invention. As shown in FIG. 2, the electrically controllable metamaterial unit includes a metal microstructure 30, a varactor diode 32, and a coaxial through hole 34. Optionally, a material of the metal microstructure 30 is any one of the following: copper, silver, and gold. Optionally, the metal microstructure 30 is a double k-shaped metal microstructure. That is, the metal microstructure 30 is formed by two k-shaped metal plates that are axisymmetric along a horizontal axis. Each k-shaped metal plate is composed of a rectangular metal plate and a half of circular ring-shaped metal plate. Optionally, the substrate material 10 is a nonmagnetic medium material, a permittivity of the substrate material 10 is from 2 to 10, and a permeability of the substrate material 10 is equal to 1.

The metal microstructure 30 is formed by two k-shaped metal microstructures. There are openings between two k-shaped metal microstructures, the opening is an opening of the metal microstructure 30, the varactor diode 32 is disposed in the opening of the metal microstructure 30. The coaxial through hole 34 is disposed on the metal microstructure 30. The metal microstructure 30 is connected to a feed network through the coaxial through hole 34 and is configured for applying a voltage across the varactor diode 15.

When a different voltage is applied across the varactor diode 15, a capacitance of the varactor diode 15 is different. In the embodiment of the present invention, the backplate feed network is connected to the metal microstructure 30 through the coaxial through hole 34, a voltage is programmably controlled by a CPU through a DAC, and the voltage is applied across the varactor diode 32 through the backplate feed network and the metal microstructure. When a DC voltage is applied across the varactor diode 15, the metal microstructure 30 can be used as a conducting wire, and no additional conducting wire needs to be used, therefore an impact of an additional conducting wire on an electromagnetic characteristic of the metamaterial is avoided.

When a reflection direction of an electromagnetic wave that is incident to a surface of the metamaterial needs to be changed, a first phase difference needs to be determined based on an angle (a predetermined angle) of a reflection direction of the electromagnetic wave, the angle needs to be obtained. There is an association relationship between the predetermined angle and the first phase difference. Then a target capacitance of the varactor diode 32 in each electrically controllable metamaterial unit is determined based on the first phase difference, and a target voltage applied across the varactor diode 32 is determined based on the target capacitance.

By adjusting the capacitance of the varactor diode 32, the electromagnetic characteristic of the metamaterial can be changed, so that electromagnetic waves reflected from two adjacent electrically controllable metamaterial units of the metamaterial have a specific phase difference. Because the phase difference is corresponding to the predetermined angle, by adjusting the phase difference, a reflection direction of the electromagnetic wave that is incident to the surface of the metamaterial can be changed.

After the target voltage is applied across the varactor diode 32, the capacitance of the varactor diode 32 is the target capacitance, a phase difference between electromagnetic waves reflected by two adjacent electrically controllable metamaterial units is the first phase difference, and an angle of the reflection direction of the electromagnetic wave is the predetermined angle. Because the predetermined angle may be any angle in a large range, it is only needed that a voltage corresponding to the predetermined angle is applied across the varactor diode 32, a direction of an electromagnetic wave that is reflected from the surface of the metamaterial can be adjusted in a large and continuous range. Therefore, a technical problem of failing to dynamically adjust the electromagnetic wave by the metamaterial in a simple and fast manner in the prior art is solved, and a technical effect of dynamically adjusting the electromagnetic wave in a simple and fast manner is achieved.

In the embodiment of the present invention, a normal incident electromagnetic wave arrives at the surface of the metamaterial, and a reflection angle is not zero. That is, the metamaterial adjusts the reflection angle of the electromagnetic wave, and the frequency of the electromagnetic wave is not changed.

Optionally, the electromagnetic wave perpendicularly incident to a surface of the metal microstructure is a plane wave, and an amplitude and a phase of the electromagnetic wave are the same in a direction that is perpendicular to an incident direction.

Optionally, the metamaterial includes a plurality of substructures, the substructure includes a plurality of row units, and a quantity of row units in each substructure and the first phase difference satisfy an expression:

$$\Delta \varphi_{deg} = \frac{360°}{N},$$

where N is the quantity of row units in each substructure, and $\Delta\varphi_{deg}$ is the first phase difference. Because the metamaterial includes at least one substructure, N may be considered as a minimum value of the quantity of row units in the metamaterial.

The metamaterial includes a plurality of same substructures. Each substructure includes a plurality of rows, and each row includes a plurality of electrically controllable metamaterial units. If a capacitance of the varactor diode 32 is adjusted, capacitances of the varactor diodes 32 in the plurality of electrically controllable metamaterial units of each row are equal.

For example, assuming that the metamaterial includes a 12×12 electrically controllable metamaterial unit array and the first phase difference is 120°, a quantity of row units in each substructure is: N=360°/120°=3.

Because each substructure includes three row units, the metamaterial has a total of 12 rows, the metamaterial includes four same substructures, each substructure includes three rows, and each row includes 12 electrically controllable metamaterial units.

Capacitances of electrically controllable metamaterial units in row 1, row 4, row 7, and row 10 of the metamaterial are the same, and are respectively equal to C1. Capacitances of electrically controllable metamaterial units in row 2, row 5, row 8, and row 11 of the metamaterial are the same, and are respectively equal to C2. Capacitances of electrically controllable metamaterial units in row 3, row 6, row 9, and row 12 of the metamaterial are the same, and are respectively equal to C3. C1, C2, and C3 are different capacitances.

Figure 3:
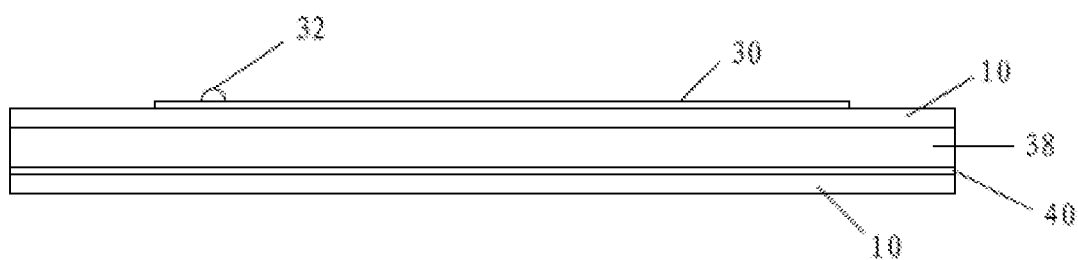
FIG. 3 is a schematic solid structural diagram of a metamaterial according to an embodiment of the present invention.

Optionally, as shown in FIG. 3, the metamaterial further includes a ground plate 40 and a foam layer 38. The foam layer 38 is disposed between the ground plate 40 and the substrate material 10. A function of the foam layer 38 is reducing a reflection loss and mitigating a phase change.

Optionally, a length and a width of the electrically controllable metamaterial unit are equal, and a distance between center points of two adjacent electrically controllable metamaterial units is the same as the length. Generally, a value range of the distance between center points of two adjacent electrically controllable metamaterial units is from ½ wavelength to 1 wavelength of the electromagnetic wave that is incident to the surface of the metamaterial.

Because a frequency of the electromagnetic wave that is incident to the surface of the metamaterial is in a specific frequency range, a frequency at a center of the frequency range is selected as a center operating frequency, and the center operating frequency is regarded as the frequency of the electromagnetic wave to perform calculation. Unless otherwise specified, the frequency of the electromagnetic wave that is incident to the surface of the metamaterial mentioned in below calculation is the center operating frequency.

Based on a relationship between the wavelength and the frequency of the electromagnetic wave, when the frequency of the electromagnetic wave is determined, the wavelength of the electromagnetic wave can be determined.

Optionally, when the frequency is 14 GHz, the length and the width of the electrically controllable metamaterial unit are equal, and are both 10 mm. A thickness of the metal microstructure 30 is 0.035 mm, a thickness of the substrate material 10 is 0.3 mm, a thickness of the foam layer 38 is 0.5 mm, a thickness of the ground plate 40 is 0.035 mm.

As shown in FIG. 2, when the frequency is 14 GHz, the length and the width of the electrically controllable metamaterial unit are the same, and are respectively equal to 10 mm; that is p=10 mm. A radius R1 of an inner ring of the metal microstructure 30 is 3 mm, and a radius R2 of an outer ring of the metal microstructure 30 is 4 mm. Two coaxial through hole 34 are respectively disposed on two k-shaped metal microstructures of the metal microstructure 30. The varactor diode 32 is disposed in an opening of the two k-shaped metal microstructures of the metal microstructure 30. A distance g between the opening of the two k-shaped metal microstructures of the metal microstructure 30 is 1 mm. The distance between center points of two adjacent electrically controllable metamaterial units is also 10 mm.

According to the embodiment of the present invention, an embodiment of the method for adjusting a reflection direction of an electromagnetic wave on the surface of the metamaterial is provided. It should be noted that the steps shown in the flowchart of drawings can be performed by computer executable instructions in a computer system. In addition, although a logical sequence is shown in the flowchart, in some circumstance, the shown or described steps may be performed in a sequence different from the sequence described herein.

Figure 4:
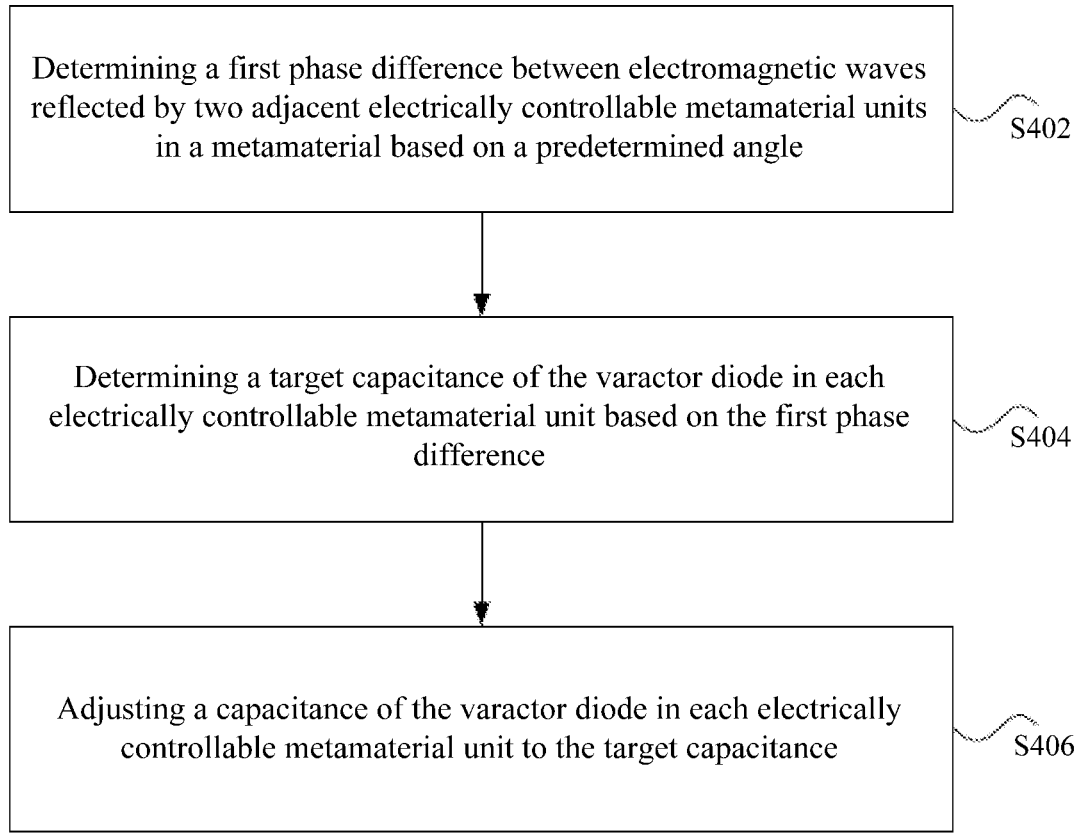
FIG. 4 is a flow chart of a method for adjusting a reflection direction of an electromagnetic wave that is reflected by a surface of a metamaterial according to an embodiment of the present invention.

An embodiment of the present invention provides a method for adjusting a reflection direction of an electromagnetic wave that is reflected by a surface of a metamaterial. FIG. 4 is a flow chart of a method for adjusting a reflection direction of an electromagnetic wave that is reflected by a surface of a metamaterial according to an embodiment of the present invention. As shown in FIG. 4, the method includes the following steps.

Step S402: determining a first phase difference between electromagnetic waves reflected by two adjacent electrically controllable metamaterial units in a metamaterial based on a predetermined angle, wherein the metamaterial includes a plurality of electrically controllable metamaterial units, the electrically controllable metamaterial unit includes a varactor diode 32, the predetermined angle is an angle at which an electromagnetic wave is reflected from a surface of the metamaterial, and there is an association relationship between the predetermined angle and the first phase difference.

Step S404: determining a target capacitance of the varactor diode 32 in each electrically controllable metamaterial unit based on the first phase difference.

Step S406: adjusting a capacitance of the varactor diode 32 in each electrically controllable metamaterial unit to the target capacitance.

When different voltages are applied across the varactor diode 32, capacitances of the varactor diode 32 are different.

When a reflection direction of an electromagnetic wave that is incident to a surface of the metamaterial needs to be changed, a first phase difference needs to be determined based on an angle (a predetermined angle) of a reflection direction of the electromagnetic wave, the angle needs to be obtained. There is an association relationship between the predetermined angle and the first phase difference. Then a target capacitance of the varactor diode 32 in each electrically controllable metamaterial unit is determined based on the first phase difference, and a target voltage applied across the varactor diode 32 is determined based on the target capacitance.

After the target voltage is applied across the varactor diode 32, the capacitance of the varactor diode 32 is the target capacitance, a phase difference between electromagnetic waves reflected by two adjacent electrically controllable metamaterial units is the first phase difference, and an angle of the reflection direction of the electromagnetic wave is the predetermined angle. Because the predetermined angle may be any angle in a large range, it is only needed that a voltage corresponding to the predetermined angle is applied across the varactor diode 32, a direction of an electromagnetic wave that is reflected from the surface of the metamaterial can be adjusted in a large and continuous range. Therefore, a technical problem of failing to dynamically adjust the electromagnetic wave by the metamaterial in a simple and fast manner in the prior art is solved, and a technical effect of dynamically adjusting the electromagnetic wave in a simple and fast manner is achieved.

For ease of description, unless otherwise specified, in this embodiment of the present invention, a normal incident electromagnetic wave arrives at the surface of the metamaterial (namely, an incident angle is zero). It should be known that this embodiment of the present invention is also applicable to a case in which an oblique incident electromagnetic wave arrives at the surface of the metamaterial.

Optionally, determining a target capacitance of the varactor diode in each electrically controllable metamaterial unit based on the first phase difference includes: obtaining a first curve in which a phase of the metamaterial changes with a frequency of the metamaterial at different capacitances; obtaining a second curve in which the phase of the metamaterial changes with the capacitance of the varactor diode at the first frequency based on the first curve and a first frequency of the electromagnetic wave that is incident to the surface of the metamaterial; and obtaining the target capacitance that is corresponding to the first phase difference from the second curve.

The first curve and the second curve are obtained through simulation by using electromagnetic simulation software CST.

Optionally, the metamaterial comprises a plurality of substructures, the substructure comprises a plurality of row units, each row unit comprises the electrically controllable metamaterial units, and obtaining the target capacitance that is corresponding to the first phase difference from the second curve includes: determining a quantity of row units in the substructure based on the first phase difference; determining a phase that is corresponding to each row unit based on the quantity of row units; obtaining a capacitance that is associated with the phase from the second curve; and regarding the obtained capacitance as the target capacitance of the corresponding row unit.

Figure 5:
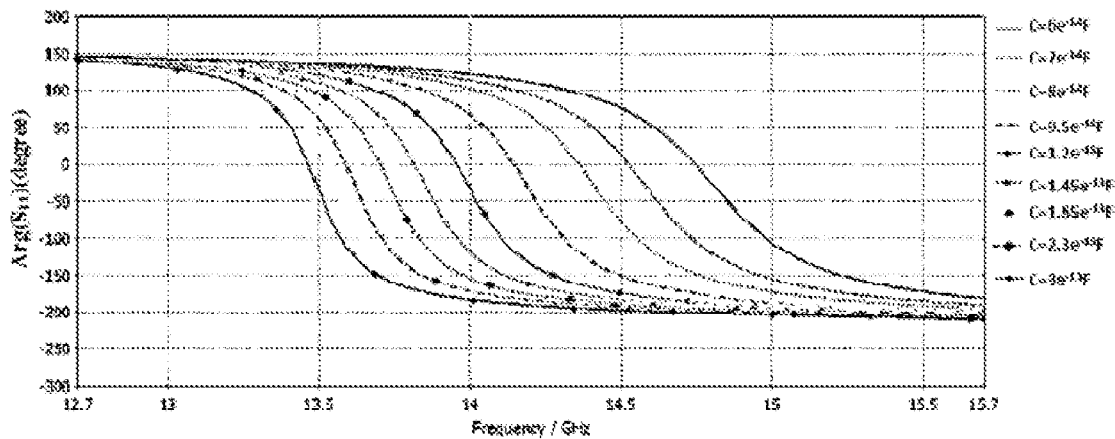
FIG. 5 illustrates a first curve according to an embodiment of the present invention.

FIG. 5 illustrates a first curve according to an embodiment of the present invention. In FIG. 5, a horizontal axis indicates a frequency, and a vertical axis indicates a phase. FIG. 5 shows a curve in which a phase changes as a frequency changes when the capacitance takes nine different values.

For each frequency, a second curve corresponding to the frequency can be obtained by means of a fitting method. The following provides detailed descriptions by using a frequency of 14 GHz as an example. It is assumed that a frequency of the electromagnetic wave that is incident to the surface of the metamaterial is 14 GHz (the foregoing first frequency).

Figure 6:
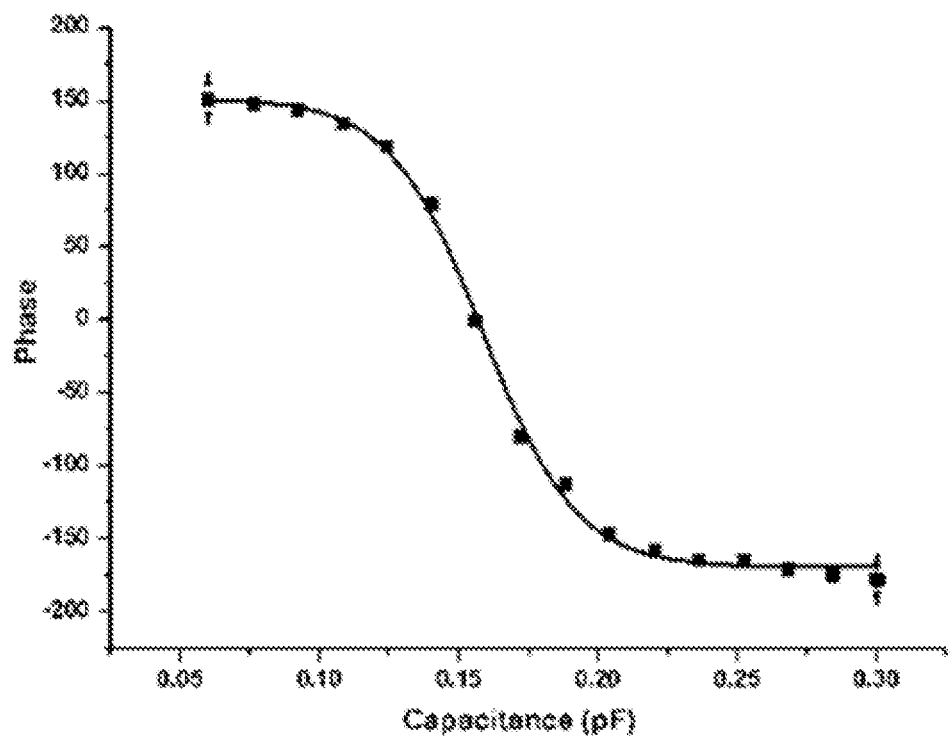
FIG. 6 illustrates a second curve when a frequency of the electromagnetic wave is 14 GHz according to an embodiment of the present invention.

In FIG. 5, a straight line is drawn. The straight line is perpendicular to the horizontal axis in FIG. 5, and an intersection point of the straight line and the horizontal axis is 14 GHz. There are nine respective intersection points between the straight line and nine curves in FIG. 5, vertical coordinates of nine intersection points are different, and horizontal coordinates of nine intersection points are the same and respectively equal to 14 GHz. Based on capacitances respectively corresponding to nine intersection points in curves, a second curve in which the phase changes with the capacitance when the first frequency is 14 GHz may be obtained through the fitting method. FIG. 6 illustrates a second curve when a frequency of the electromagnetic wave is 14 GHz according to an embodiment of the present invention. A horizontal axis of the second curve indicates a capacitance, and a vertical axis of the second curve indicates a phase.

By using the foregoing method, a second curve in which a phase changes with a capacitance at any frequency in the first curve may be obtained. In addition, when there are more curves in the first curve, a second curve obtained through the fitting method is more smooth.

Optionally, determining a quantity of row units in the substructure based on the first phase difference includes: determining the quantity of row units by using the following formula:

$$\Delta\varphi_{deg} = \frac{360°}{N},$$

where N is the quantity of row units in each substructure, and $\Delta\varphi_{deg}$ is the first phase difference.

Optionally, adjusting a capacitance of the varactor diode 32 in each electrically controllable metamaterial unit to the target capacitance includes: searching a target voltage that is corresponding to the target capacitance from a predetermined association relationship between a capacitance and a voltage; and applying the target voltage across the varactor diode 32.

After the second curve is obtained, the target capacitance corresponding to the first phase difference is obtained from the second curve. To describe this process clearly, in the embodiment of the present invention, the following example 1 and example 2 are explained.

Example 1 it is assumed that the metamaterial is 12×12 electrically controllable metamaterial unit array and the first phase difference is 120°, that is, a phase difference between electromagnetic waves reflected by two adjacent electrically controllable metamaterial units is 120°, a quantity of row units in each substructure is: N=360°/120°=3, namely, one substructure includes three rows. It is assumed that a frequency of the electromagnetic wave that is incident to the surface of the metamaterial is 14 GHz, a phase of the electrically controllable metamaterial unit in row 1 of the substructure may be equal to −120°, a phase of the electrically controllable metamaterial unit in row 2 of the substructure may be equal to 0°, and a phase of the electrically controllable metamaterial unit in row 3 of the substructure may be equal to 120°.

The capacitances corresponding to the phase −120°, the phase 0°, and the phase 120° are respectively acquired from FIG. 6. It is assumed that the capacitance corresponding to the phase −120° is C (−120°), the capacitance corresponding to the phase 0° is C (0°), and the capacitance corresponding to the phase 120° is C (120°). The three capacitances are target capacitances. A capacitance of the varactor diode 32 in row 1 of each substructure is adjusted to C (−120°), a capacitance of the varactor diode 32 in row 2 of each substructure is adjusted to C (0°), and a capacitance of the varactor diode 32 in row 3 of each substructure is adjusted to C (120°). That is, capacitances of varactor diodes in row 1, row 4, row 7, and row 10 of the metamaterial are respectively adjusted to C (−120°); capacitances of varactor diodes in row 2, row 5, row 8, and row 11 of the metamaterial are respectively adjusted to C (0°); and capacitances of varactor diodes in row 3, row 6, row 9, and row 12 of the metamaterial are respectively adjusted to C (120°). Therefore, a phase difference between each two adjacent rows in the metamaterial is 120°. It should be noted that a phase of row 3 is 120°, a phase of row 4 is −120°, and a phase difference between row 4 and row 3 is (−120°)−120°=−240°. Because the phase difference between row 4 and row 3 is −240°, the phase difference between row 4 and row 3 can also be considered as 120°.

It should be noted that, in the foregoing process of reading the capacitances from FIG. 6, only one manner of taking a value of the phase of the electronically controllable metamaterial unit is listed. Actually, there are numerous manners of taking values of phases of electronically controllable metamaterial units in row 1, row 2, and row 3 of a substructure. For example, the phases of the electronically controllable metamaterial units in row 1, row 2, and row 3 of the substructure may be respectively equal to −110°, 10°, and 130°; or the phases of the electronically controllable metamaterial units in row 1, row 2, and row 3 of the substructure may be respectively equal to −100°, 20°, and 140°; or the phases of the electronically controllable metamaterial units in row 1, row 2, and row 3 of the substructure may be respectively equal to −101°, 19°, and 139°.

Example 2

It is assumed that the metamaterial is 12×12 electrically controllable metamaterial unit array and the first phase difference is 90°, that is, a phase difference between electromagnetic waves reflected by two adjacent electrically controllable metamaterial units is 90°, a quantity of row units in each substructure is: N=360°/90°=4, namely, one substructure includes four rows. A phase of the electrically controllable metamaterial unit in row 1 of the substructure may be equal to −150°, a phase of the electrically controllable metamaterial unit in row 2 of the substructure may be equal to −60°, a phase of the electrically controllable metamaterial unit in row 3 of the substructure may be equal to 30°, and a phase of the electrically controllable metamaterial unit in row 4 of the substructure may be equal to 120°.

The capacitances corresponding to the phase −150°, the phase −60°, the phase 30°, and the phase 120° are respectively acquired from FIG. 6. It is assumed that a capacitance corresponding to the phase −150° is C (−150°), a capacitance corresponding to the phase −60° is C (−60°), a capacitance corresponding to the phase 30° is C (30°), and a capacitance corresponding to the phase 120° is C (120°).

The four capacitances are target capacitances. A capacitance of the varactor diode 32 in row 1 of each substructure is adjusted to C (−150°), a capacitance of the varactor diode 32 in row 2 of each substructure is adjusted to C (−60°), a capacitance of the varactor diode 32 in row 3 of each substructure is adjusted to C (30°), and a capacitance of the varactor diode 32 in row 4 of each substructure is adjusted to C (120°). That is, capacitances of varactor diodes in row 1, row 5, and row 9 of the metamaterial are respectively adjusted to C (−150°); capacitances of varactor diodes in row 2, row 6, and row 10 of the metamaterial are respectively adjusted to C (−60°); capacitances of varactor diodes in row 3, row 7, and row 11 of the metamaterial are respectively adjusted to C (30°); and capacitances of varactor diodes in row 4, row 8, and row 12 of the metamaterial are respectively adjusted to C (120°). Therefore, a phase difference between each two adjacent rows in the metamaterial is 90°. It should be noted that a phase of row 4 is 120°, a phase of row 5 is −150°, and a phase difference between row 5 and row 4 is (−150°)−120°=−270°. The phase difference between row 4 and row 3 is −270°, the phase difference between row 4 and row 3 can also be considered as 90°.

It should be noted that, in the foregoing process of reading the capacitances from FIG. 6, only one manner of taking a value of the phase of the electronically controllable metamaterial unit is listed. Actually, there are numerous manners of taking values of phases of electronically controllable metamaterial units in row 1, row 2, row 3, and row 4 of a substructure. For example, the phases of the electronically controllable metamaterial units in row 1, row 2, row 3, and row 4 of the substructure may be respectively equal to −151°, −61°, 29°, and 119°; or the phases of the electronically controllable metamaterial units in row 1, row 2, row 3, and row 4 of the substructure may be respectively equal to −152°, −62°, 28°, and 118°; or the phases of the electronically controllable metamaterial units in row 1, row 2, row 3, and row 4 of the substructure may be respectively equal to −149°, −59°, 31°, and 121°.

Optionally, determining a first phase difference between electromagnetic waves reflected by two adjacent electrically controllable metamaterial units in a metamaterial based on a predetermined angle includes: determining the first phase difference based on $$\theta = \arcsin\left(\frac{\lambda}{p} \cdot \frac{\Delta\varphi_{deg}}{360°}\right),$$

where θ is the predetermined angle, $\Delta\varphi_{deg}$ is the first phase difference, λ is a wavelength of the electromagnetic wave, p is a length of the electrically controllable metamaterial unit; a length and a width of the electrically controllable metamaterial unit are equal, and a distance between center points of the two adjacent electrically controllable metamaterial units is the same as the length of the electrically controllable metamaterial unit.

When the length and the width of the electrically controllable metamaterial unit are equal, the distance between center points of the two adjacent electrically controllable metamaterial units is equal to the length (or the width) of the electrically controllable metamaterial unit. For example, it is assumed that a frequency of an electromagnetic wave is 14 GHz, and P=10 mm. Based on a relationship between a wavelength and a frequency, it can be learned that a wavelength λ of the electromagnetic wave is approximately equal to 21.43 mm.

When the first phase difference $\Delta\varphi_{deg}$ is equal to 120°, based on $$\theta = \arcsin\left(\frac{\lambda}{p} \cdot \frac{\Delta\varphi_{deg}}{360°}\right),$$

it can be obtained by calculation that θ=45.6°.

When the first phase difference $\Delta\varphi_{deg}$ is equal to 90°, based on $$\theta = \arcsin\left(\frac{\lambda}{p} \cdot \frac{\Delta\varphi_{deg}}{360°}\right),$$

it can be obtained by calculation that $\theta=32.4°$.

Figures 1, 7:
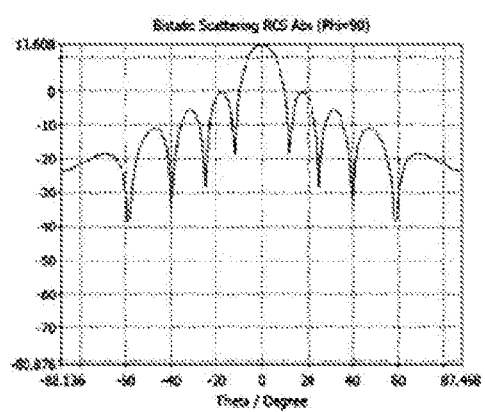
Figures 2, 7:
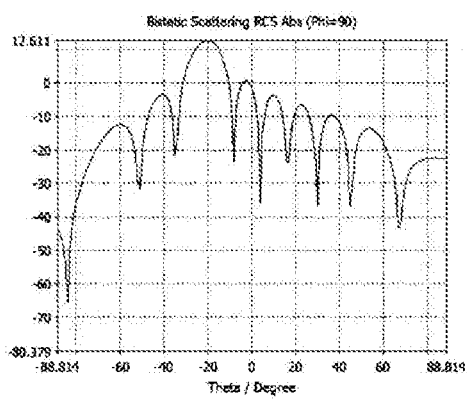
Figures 3, 7:
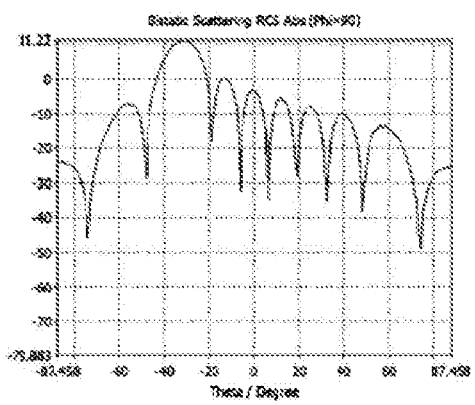
Figures 4, 7:
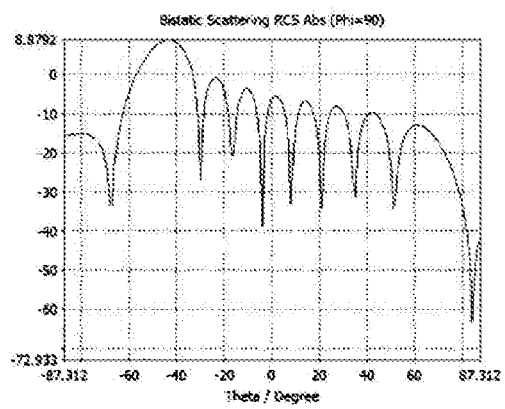

FIG. 7-1 is a curve in which reflectivity of an electromagnetic wave that is reflected from a surface of the metamaterial changes with a reflection angle when a first phase difference $\Delta\varphi_{deg}$ is equal to zero and a predetermined angle $\theta$ is equal to zero according to an embodiment of the present invention. The curve of FIG. 7-1 is obtained when no voltage is applied across the varactor diode 32. It can be seen that the reflectivity reaches a maximum value when the reflection angle is equal to zero.

FIG. 7-2 is a curve in which reflectivity of the electromagnetic wave that is reflected from a surface of the metamaterial changes with a reflection angle when a first phase difference $\Delta\varphi_{deg}$ is equal to 60° and a predetermined angle $\theta$ is equal to 22.1° according to an embodiment of the present invention. When the first phase difference $\Delta\varphi_{deg}$ deg is equal to 60°, each substructure includes six row units. Capacitances of varactor diodes 32 in the six row units are respectively adjusted. After adjustment, capacitances of the varactor diodes 32 in row 1 to row 6 are respectively equal to C (−150°), C (−90°), C (−30°), C (30°), C (90°), and C (150°). All these capacitances can be acquired from FIG. 6. After adjustment, it can be seen that the reflectivity reaches a maximum value when the reflection angle is equal to −22.1°. Similarly, if capacitances of the varactor diodes 32 in row 1 to row 6 are respectively equal to C (150°), C (90°), C (30°), C (−30°), C (−90°), and C (−150°), the reflectivity reaches a maximum value when the reflection angle is equal to 22.1°. Whether a deflection of a reflected beam is a positive value or a negative value is related to whether the phase difference increases progressively or decreases progressively.

FIG. 7-3 is a curve in which reflectivity of an electromagnetic wave that is reflected from a surface of the metamaterial changes with a reflection angle when a first phase difference $\Delta\varphi_{deg}$ is equal to 90° and a predetermined angle $\theta$ is equal to 32.4° according to an embodiment of the present invention. When the first phase difference $\Delta\varphi_{deg}$ is equal to 90°, each substructure includes four row units. Capacitances of varactor diodes 32 in the four row units are respectively adjusted. After adjustment, capacitances of the varactor diodes 32 in row 1 to row 4 are respectively equal to C (−150°), C (−60°), C (30°), and C (120°). All these capacitances can be acquired from FIG. 6. After adjustment, it can be seen that the reflectivity reaches a maximum value when the reflection angle is equal to −32.4°. That is, the reflectivity reaches a maximum value at the predetermined angle of 32.4°.

FIG. 7-4 is a curve in which reflectivity of an electromagnetic wave that is reflected from a surface of the metamaterial changes with a reflection angle when a first phase difference $\Delta\varphi_{deg}$ is equal to 120° and a predetermined angle $\theta$ is equal to 45.6° according to an embodiment of the present invention. When the first phase difference $\Delta\varphi_{deg}$ is equal to 120°, each substructure includes three row units. Capacitances of varactor diodes 32 in the three row units are respectively adjusted. After adjustment, capacitances of the varactor diodes 32 in row 1 to row 3 are respectively equal to C (−150°), C (−30°), and C (90°). All these capacitances can be acquired from FIG. 6. After adjustment, it can be seen that the reflectivity reaches a maximum value when the reflection angle is equal to −45.6°. That is, the reflectivity reaches a maximum value at a predetermined angle of 45.6°.

After a required reflection angle (namely, the foregoing predetermined angle) is determined, a first phase difference is calculated based on the predetermined angle. A target capacitance of a varactor diode 32 in an electrically controllable metamaterial unit in each row of the metamaterial is determined based on the first phase difference.

The target voltage corresponding to the target capacitance is determined based on a relationship between a capacitance and a voltage of the varactor diode 32, and the voltage of the varactor diode 32 is adjusted to the target voltage.

In this way, an electromagnetic wave that is incident to the surface of the metamaterial is reflected at the predetermined angle. The predetermined angle may be any angle in a range from 0 to 90°. In addition, there is no special requirement for a frequency of the electromagnetic wave.

When a frequency of the electromagnetic wave is from 0.3 GHz to 300 GHz, the method provided in the embodiment of the present invention can be used to adjust the reflection angle. It should be noted that, when a frequency of the electromagnetic wave that is incident to the surface of the metamaterial changes, the target capacitance changes, thus the target capacitance needs to be recalculated. Alternatively, a parameter of the metal microstructure 30 can be modified to suit for a change of a frequency of an electromagnetic wave that is incident to the surface of the metamaterial.

In the embodiment of the present invention, the entire apparatus is fixed, it is only required that a bias voltage applied across the varactor diode 32 is controlled, a resonant frequency in a plurality of frequency bands, a phase, and a reflection angle of the electromagnetic wave can be continuously adjusted in a large range. Therefore, an electromagnetic performance of the metamaterial is continuously controlled, and an adjustment range of electromagnetic parameters is widen.

In addition, the apparatus has a compact structure, high integration, a simple structure, a small size, a light weight, convenient manufacturing, and low costs, and can not only be applied to the field of scanning panel antennas but also be applied to the field of the frequency selective surface and the field of reducing radar cross section. This greatly improves a capability of the same metamaterial to suit for different environments.

Figure 8:
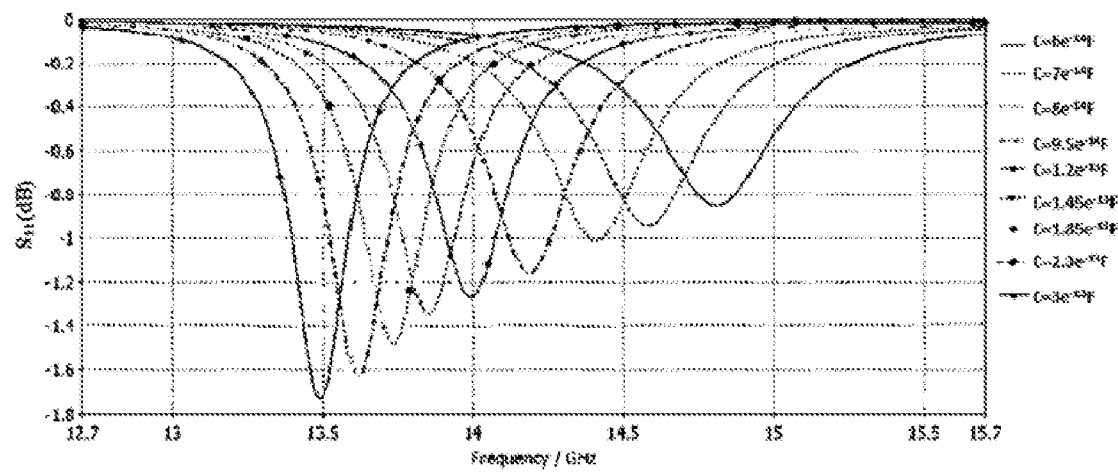
FIG. 8 is a curve in which a reflection loss of an electromagnetic wave that is incident to a surface of the metamaterial changes with a frequency when different capacitances are selected according to an embodiment of the present invention.

FIG. 8 is a curve in which a reflection loss of an electromagnetic wave that is incident to a surface of the metamaterial changes with a frequency when different capacitances are selected according to an embodiment of the present invention. A reflection loss reaches a maximum value if the frequency is equal to a resonant frequency. It can be seen from FIG. 8 that the reflection loss is within −2 dB, if the capacitance is smaller, the resonant frequency is greater; and if the capacitance is greater, the resonant frequency is smaller. For example, when the capacitance is equal to 3e-13F (namely, 0.3 pF), the resonant frequency is approximately equal to 13.49 GHz; and when the capacitance value is equal to 6e-14F (namely, 0.06 pF), the resonant frequency is approximately equal to 14.82 GHz.

Optionally, a relationship between the resonant frequency and the capacitance may be determined by using the following formula:

$$\omega = \frac{1}{2\pi\sqrt{LC}},$$

where ω is the resonant frequency, L is an inductance of the varactor diode, and C is a capacitance of the varactor diode.

Optionally, a reflection loss is less than −2 dB when an electromagnetic wave is reflected from the surface of the metamaterial.

Optionally, a frequency of an electromagnetic wave that is incident to the surface of the metamaterial is from 0.3 GHz to 300 GHz. In other words, the metamaterial according to the embodiment of the present invention is applicable to a very large frequency range.

Optionally, the capacitance of the varactor diode is from 0.06 pF to 3 pF.

In the embodiment of the present invention, a periodic boundary condition is designed; the capacitance of the varactor diode 32 is changed from 0.06 pF and 3 pF, therefore a reflection phase has a change of about 360°; a bandwidth is about 1 GHz; a reverse bias voltage applied across the varactor diode 32 is from 0 V to 20 V; and the reflection loss is less than −2 dB, which is relatively small.

The metamaterial provided in this embodiment of the present invention has superior performance of adjusting a phase of the electromagnetic wave, and provides a new technological approach for development of modern satellite and radar wireless communication technologies. When the metamaterial provided in this embodiment of the present invention is applied to an electrically controlled scanning antenna based on an electrically controllable metamaterial structure, technical effects of electrically controlling directivity of a radiating electromagnetic beam, and sensitively and continuously scanning the electromagnetic wave beam can be achieved, thereby establishing a technical foundation for multifunctional smart antennas of next-generation communication platforms such as a space station and a near-earth aerial platform.

Sequence numbers of the foregoing embodiments of the present invention are merely used for description, and do not indicate superiority or inferiority of the embodiments.

In the foregoing embodiments of the present invention, descriptions of the embodiments have respective emphases. For a part not described in detail in an embodiment, reference may be made to related descriptions in another embodiment.

In the several embodiments provided in the present invention, it should be understood that the disclosed technical content may be implemented in other manners. The described apparatus embodiments are merely examples. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the units or modules may be implemented in electrical or other forms.

The units described as separate parts may or may not be physically separated, and parts shown as units may or may not be physical units, may be located in one position, or may be distributed on a plurality of units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The computer software product is stored in a storage medium and includes several instructions for instructing a computer device (which may be a personal computer, a server, a network device, or the like) to perform all or some of the steps of the methods described in the embodiments of the present invention. The foregoing storage medium includes any medium that can store program code, such as a USB flash drive, a read-only memory (ROM, Read-Only Memory), a random access memory (RAM, Random Access Memory), a removable hard disk, a magnetic disk, or an optical disc.

The foregoing descriptions are merely preferred implementations of the present invention. It should be noted that, improvements and modifications may be further made by a person of ordinary skill in the art without departing from the principles of the present invention, and these improvements and modifications shall also be construed as falling within the protection scope of the present invention.

What is claimed is:

1. A method for adjusting an electromagnetic wave, comprising:
    determining a first phase difference between electromagnetic waves reflected by two adjacent electrically controllable metamaterial units in a metamaterial based on a predetermined angle; wherein the metamaterial comprises a plurality of electrically controllable metamaterial units, the electrically controllable metamaterial unit comprises a varactor diode; the predetermined angle is an angle at which an electromagnetic wave is reflected from a surface of the metamaterial; there is an association relationship between the predetermined angle and the first phase difference;
    determining a target capacitance of the varactor diode in each electrically controllable metamaterial unit based on the first phase difference; and
    adjusting a capacitance of the varactor diode in each electrically controllable metamaterial unit to the target capacitance;
    wherein the varactor diode is disposed in an opening of a metal microstructure, and the metal microstructure is a double k-shaped metal microstructure.

2. The method of claim 1, wherein determining a target capacitance of the varactor diode in each electrically controllable metamaterial unit based on the first phase difference comprises:
    obtaining a first curve in which a phase of the metamaterial changes with a frequency of the metamaterial at different capacitances;
    obtaining a second curve in which the phase of the metamaterial changes with the capacitance of the varactor diode at a first frequency based on the first curve and the first frequency of the electromagnetic wave that is incident to the surface of the metamaterial; and obtaining the target capacitance that is corresponding to the first phase difference from the second curve.

3. The method of claim 2, wherein the metamaterial comprises a plurality of substructures, the substructure comprises a plurality of row units, each row unit comprises the electrically controllable metamaterial units, and obtaining the target capacitance that is corresponding to the first phase difference from the second curve comprises:
   determining a quantity of row units in the substructure based on the first phase difference;
   determining a phase that is corresponding to each row unit based on the quantity of row units;
   obtaining a capacitance that is associated with the phase from the second curve; and
   regarding the obtained capacitance as the target capacitance of the corresponding row unit.

4. The method of claim 3, wherein determining a quantity of row units in the substructure based on the first phase difference comprises:
   determining the quantity of row units based on the following formula:

$$\Delta\varphi_{deg} = \frac{360°}{N},$$

wherein N is the quantity of row units in each substructure, and $\Delta\varphi_{deg}$ is the first phase difference.

5. The method of claim 1, wherein adjusting a capacitance of the varactor diode in each electrically controllable metamaterial unit to the target capacitance comprises:
   searching a target voltage that is corresponding to the target capacitance from a predetermined association relationship between a capacitance and a voltage; and
   applying the target voltage across the varactor diode.

6. The method of claim 5, wherein applying the target voltage across the varactor diode comprises:
   applying the target voltage across the varactor diode, which is disposed in the opening of the metal microstructure of the electrically controllable metamaterial unit, by the metal microstructure; wherein the metal microstructure is connected to a feed network through an coaxial through hole that is disposed on the metal microstructure.

7. The method of claim 1, wherein determining a first phase difference between electromagnetic waves reflected by two adjacent electrically controllable metamaterial units in a metamaterial based on a predetermined angle comprises:
   determining the first phase difference based on the formula:

$$\theta = \arcsin\left(\frac{\lambda}{p} \cdot \frac{\Delta\varphi_{deg}}{360°}\right),$$

wherein θ is the predetermined angle, $\Delta\varphi_{deg}$ is the first phase difference, λ is a wavelength of the electromagnetic wave, p is a length of the electrically controllable metamaterial unit; a length and a width of the electrically controllable metamaterial unit are equal, and a distance between center points of the two adjacent electrically controllable metamaterial units is equal to the length of the electrically controllable metamaterial unit.

8. The method of claim 1, wherein the capacitance of the varactor diode is from 0.06 pF to 3 pF.

9. The method of claim 1, wherein a reflection loss of an electromagnetic wave that is reflected from a surface of the metamaterial is less than −2 dB.

10. A metamaterial, comprising:
    a substrate material; and
    an electrically controllable metamaterial unit array attached on the substrate material and comprising a plurality of electrically controllable metamaterial units; wherein the electrically controllable metamaterial unit comprises:
    a metal microstructure;
    a varactor diode disposed in an opening of the metal microstructure; and
    a coaxial through hole disposed on the metal microstructure; wherein the metal microstructure is connected to a feed network through the coaxial through hole and is configured for applying a voltage across the varactor diode;
    wherein the metal microstructure is a double k-shaped metal microstructure.

11. The metamaterial of claim 10, wherein a material of the metal microstructure is any one of the following: copper, silver, and gold.

12. The metamaterial of claim 10, wherein the substrate material is a nonmagnetic medium material, a permittivity of the substrate material is from 2 to 10, and a permeability of the substrate material is equal to 1.

13. The metamaterial of claim 10, wherein an electromagnetic wave perpendicularly incident to a surface of the metal microstructure is a plane wave, an amplitude and a phase of the electromagnetic wave are the same in a direction that is perpendicular to the incident direction.

14. The metamaterial of claim 10, wherein the metamaterial comprises a plurality of substructures, the substructure comprises a plurality of row units, a quantity of row units in each substructure and a first phase difference satisfy an expression:

$$\Delta\varphi_{deg} = \frac{360°}{N},$$

wherein N is the quantity of row units in each substructure, and $\Delta\varphi_{deg}$ is the first phase difference; there is the first phase difference between electromagnetic waves reflected by two adjacent electrically controllable metamaterial units in the metamaterial.

15. The metamaterial of claim 10, wherein a length and a width of the electrically controllable metamaterial unit are equal, and a distance between center points of two adjacent electrically controllable metamaterial units is the same as the length of the electrically controllable metamaterial unit.

16. The metamaterial of claim 10, wherein the metamaterial further comprises:
    a ground plate; and
    a foam layer disposed between the ground plate and the substrate material.

17. The metamaterial of claim 10, wherein a frequency of an electromagnetic wave that is incident to a surface of the metamaterial is from 0.3 GHz to 300 GHz.

18. The metamaterial of claim 10, wherein a capacitance of the varactor diode is from 0.06 pF to 3 pF.

19. The metamaterial of claim 10, wherein a reflection loss of an electromagnetic wave that is reflected from a surface of the metamaterial is less than −2 dB.

* * * * *